United States Patent [19]
MacDonald

[11] Patent Number: 5,475,322
[45] Date of Patent: Dec. 12, 1995

[54] CLOCK FREQUENCY MULTIPLYING AND SQUARING CIRCUIT AND METHOD

[75] Inventor: James B. MacDonald, Dracut, Mass.

[73] Assignee: Wang Laboratories, Inc., Billerica, Mass.

[21] Appl. No.: 135,113

[22] Filed: Oct. 12, 1993

[51] Int. Cl.[6] .................................................. H03K 3/017
[52] U.S. Cl. ........................... 326/93; 327/116; 327/122; 327/175; 377/47
[58] Field of Search ................................... 307/265, 269, 307/480, 529, 595, 601, 602; 328/63; 377/47; 326/93, 95, 98; 327/113, 116, 120, 122, 175, 254, 257

[56] References Cited

U.S. PATENT DOCUMENTS

| 4,077,010 | 2/1978 | Ryon | 328/20 |
|---|---|---|---|
| 4,999,526 | 3/1991 | Dudley | 307/269 |
| 5,063,578 | 11/1991 | Diodato | 377/47 |
| 5,103,114 | 4/1992 | Fitch | 307/265 X |
| 5,227,682 | 7/1993 | Nakabayashi et al. | 307/269 X |
| 5,317,202 | 5/1994 | Waizman | 307/269 |
| 5,321,728 | 6/1994 | Andrieu | 307/480 X |
| 5,321,734 | 6/1994 | Ogata | 377/47 |

FOREIGN PATENT DOCUMENTS 1118997  7/1968  United Kingdom .

OTHER PUBLICATIONS

Electronics, vol. 51, No. 6, 16 Mar. 1978, New York, US pp. 119–121 Patel "Frequency Multiplier Uses Combinational Logic".

IBM Technical Disclosure Bulletin, Aug. 1985, USA vol. 28, No. 3 p. 1307 "Multiple Clock Frequency Generation".

Electronic Engineering vol. 50, No. 607, May 1978, London GB pp. 29–32 Zagajewski et al. "Pulse Multiplication Using Walsh Functions".

International Journal of Electronics, vol. 48, No. 1, 1980, London, GB. pp. 43–45 Kumar et al. "A Simple Digital 2n Frequency Multiplier".

P. Horowitz & W. Hill: "The Art of Electronics", Cambridge University Press, 1980, Cambridge, GB; p. 332.

Primary Examiner—David R. Hudspeth
Attorney, Agent, or Firm—Kenneth L. Milik

[57] ABSTRACT

A circuit (10) for generating an output signal having a frequency that is a multiple of an input clock signal (CLKIN). The circuit includes a delay circuit (12) having an input port and a plurality of output ports (A,B,C). The input port is coupled during use to the input clock signal. Individual ones of the plurality of output ports output a signal that is delayed with respect to the input clock signal and also with respect to others of the plurality of output ports. The circuit further includes a logic network (20) having a first input for coupling to the input clock signal and a plurality of second inputs for coupling to the plurality of output ports. The logic network operates to logically combine signals emanating from the plurality of output ports with the input clock signal, and has an output port (OUTPUT) for outputting a signal having a frequency that is multiple of a frequency of the input clock signal. The signal that is output from the output port of the logic network has a 50% duty cycle regardless of the duty cycle of the input clock signal.

17 Claims, 2 Drawing Sheets

CLOCK FREQUENCY MULTIPLYING AND SQUARING CIRCUIT AND METHOD

FIELD OF THE INVENTION

This invention relates generally to frequency multiplication techniques and, in particular, to techniques for providing a clock frequency in a digital data processor.

BACKGROUND OF THE INVENTION

When constructing a digital data processor it is often the case that a plurality of different clock frequencies are required for different components or sub-systems. As an example, a system bus may interconnect a plurality of printed circuit cards or modules. The system bus will often include one or more signal lines that convey a synchronizing clock frequency. If a particular circuit card or module requires one of the clock frequencies, it is a relatively simple operation to input the desired clock frequency from the system bus, buffer same, and distribute the buffered clock to the appropriate component(s). If some sub-multiple of the clock frequency is required, it is also a relatively simple operation to provide one or more flip/flops to divide the input clock frequency to the desired frequency. Frequency division also typically inherently provides a symmetrical (50% duty cycle) waveform.

However, a problem is encountered when some multiple of the input clock frequency is required.

One approach is to provide a separate oscillator on the circuit card or module to provide the desired higher frequency. However, clock oscillators are generally expensive, and may require a substantial amount of printed circuit board area. Furthermore, the output frequency signal of the separate clock oscillator will generally be asynchronous to the system bus clock. As a result, additional synchronizing circuitry may be required if the local, higher frequency clock is required to have some predetermined phase relationship to the system bus clock.

OBJECTS OF THE INVENTION

It is therefore one object of this invention to provide an apparatus and a method for generating a second, higher frequency clock from a first clock signal that does not require a separate oscillator circuit.

It is another object of this invention to provide an apparatus and a method for generating a second, higher frequency clock from a first clock signal such that the second, higher frequency clock is synchronized to the first clock signal.

It is a further object of this invention to provide an apparatus and a method for generating a second, higher frequency clock from a first clock signal such that the second, higher frequency clock has a near perfect 50% duty cycle, regardless of the duty cycle of the first clock.

SUMMARY OF THE INVENTION

The foregoing and other problems are overcome and the objects of the invention are realized by the disclosed circuit and method of operating same which multiplies the frequency of an input clock, thus eliminating the need for additional oscillators and associated synchronizing circuitry. The use of this invention enables the doubling (or any multiple of two) of the system clock while maintaining synchronization, using very little logic and printed circuit board space. An added advantage of the circuit of this invention is that the multiplied clock frequency has a near perfect 50% duty cycle, regardless of the input (system clock) duty cycle.

More particularly, this invention provides a circuit for generating an output signal having a frequency that is a multiple of an input clock signal. The circuit includes a delay circuit having an input port and a plurality of output ports. The input port is coupled during use to the input clock signal. Individual ones of the plurality of output ports output a signal that is delayed with respect to the input clock signal and also with respect to others of the plurality of output ports. The circuit further includes a logic network having a first input for coupling to the input clock signal and a plurality of second inputs for coupling to the plurality of output ports. The logic network operates to logically combine signals emanating from the plurality of output ports with the input clock signal, and has an output port for outputting a signal having a frequency that is multiple of a frequency of the input clock signal. The signal that is output from the output port of the logic network has a 50% duty cycle regardless of the duty cycle of the input clock signal.

In a presently preferred embodiment of this invention the delay circuit includes: a first delay element having an input for coupling to the input clock signal and an output coupled to a first one of the plurality of output nodes; a second delay element having an input coupled to the output of the first delay element and an output coupled to a second one of the plurality of output nodes; and a third delay element having an input coupled to the output of the second delay element and an output coupled to a third one of the plurality of output nodes. Each of the delay elements introduces an equal amount of delay to a signal propagating therethrough, by example, a delay equal to approximately 25% of the period of the input clock signal.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
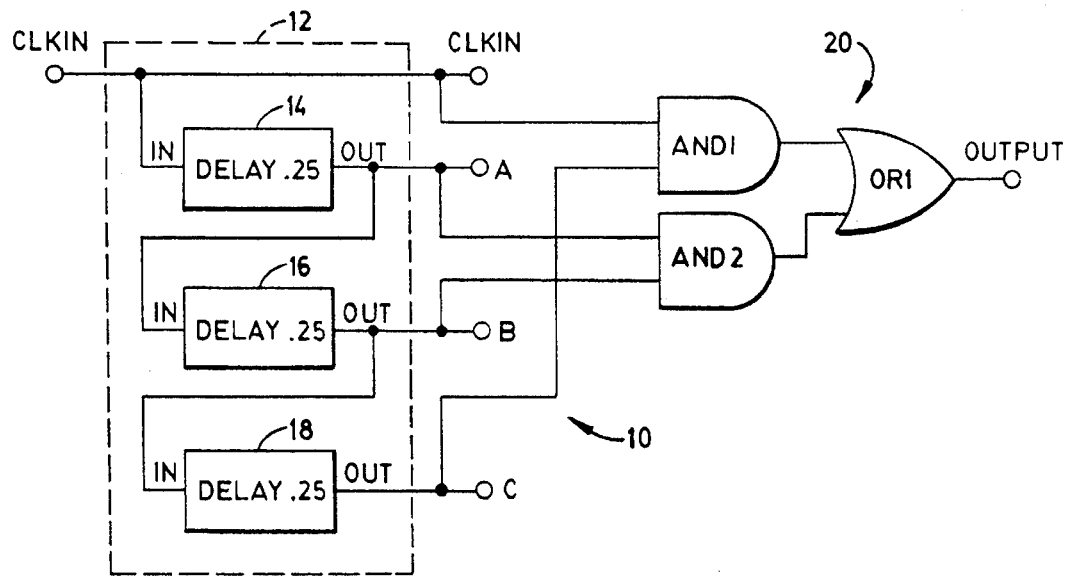
FIG. 1 is a circuit diagram of a first embodiment of this invention.
Figure 2:
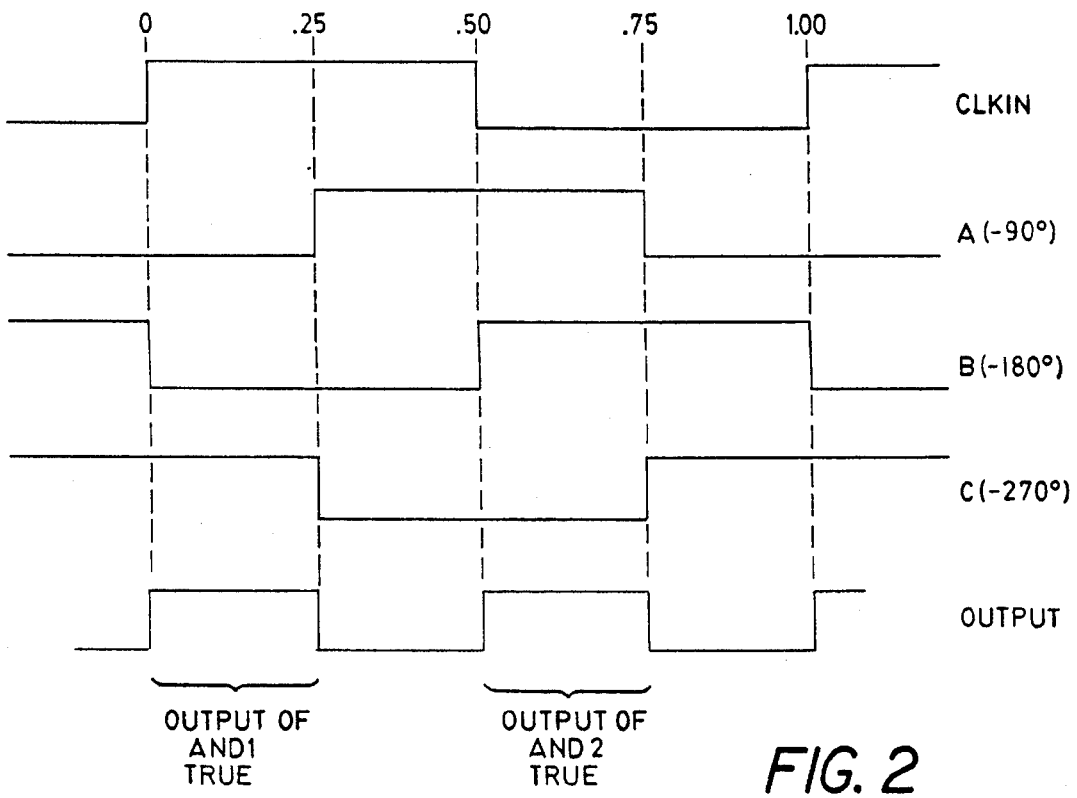
FIG. 2 is a diagram showing the various waveforms that are associated with the circuit of FIG. 1.

FIG. 1 is best understood by viewing same in conjunction with the waveform diagram of FIG. 2. A clock generation circuit 10 includes a delay circuit 12 having a plurality of separate delay elements 14, 16, and 18. Each of the delay elements 14, 16 and 18 provides a substantially equal amount of delay. An input clock signal (CLKIN) is provided as an input to the delay element 12, which provides a delayed version to an input of delay element 16. Delay element 16 in turn provides a twice delayed version of CLKIN to the input of delay element 18. The output of each delay element 14, 16, and 18 is provided at an associated output node A, B, and C, respectively, of the delay circuit 12. The CLKIN signal is also provided at an output node. As a result, the CLKIN output node outputs the original input clock signal, node A outputs a once delayed version of CLKIN, node B outputs a twice delayed version of CLKIN, and node C outputs a thrice delayed version of CLKIN. Of course, the CLKIN signal need not be provided as an output from the delay circuit 12, as this signal is available at the input to the circuit 12. In the illustrated embodiment, each of the delay elements 14, 16 and 18 applies an amount of delay that is equal to one quarter (25%) of the period of the input signal CLKIN. For example, if CLKIN has a frequency of 20 MHz (period 50 nanoseconds) then each of the delay elements 14, 16, and 18 applies a 12.5 nanosecond delay to the signal that appears at its input.

Alternately, it can be stated that the CLKIN output node outputs the original input signal with a zero degree phaseshift, the node A outputs a signal that is retarded by 90 degrees with respect to CLKIN, the node B outputs a signal that is retarded by 180 degrees with respect to CLKIN, and the node C outputs a signal that is retarded by 270 degrees with respect to CLKIN.

Further in accordance with this invention there is provided a logic circuit 20 having inputs coupled to the CLKIN, A, B and C output nodes and an output (OUTPUT) that provides an output clock signal having a frequency that is a multiple (specifically 2) of the CLKIN frequency. In this embodiment of the invention the logic circuit 20 includes two AND gates (AND1, AND2) and an OR gate (OR1) that are interconnected as shown to logically combine the various input signals. The inputs of AND1 and AND2 are connected to the output nodes of the delay circuit 12 in such a manner that the output of AND1 is asserted (logic 1 or true) during the time that CLKIN and node C are both true, and the output of AND2 is asserted during the time that the nodes A and B are both true. The result is that the signal that appears at the OUTPUT, via OR1, has a frequency that is two times that of CLKIN or, in accordance with the example given above, with a frequency of 40 MHz.

It is noted that the signal appearing at the OUTPUT is symmetrical, and thus has a 50% duty cycle. It is further noted that the signal appearing at the OUTPUT is synchronized to the CLKIN signal. That is, the rising and falling edges of the OUTPUT signal occur with a predetermined and unchanging temporal or phase relationship to the rising and falling edges of the CLKIN signal.

The signal that appears at the OUTPUT may thus be distributed to one or more components that require a 40 MHz clock signal (twice the CLKIN frequency), which is the desired result.

Figure 3:
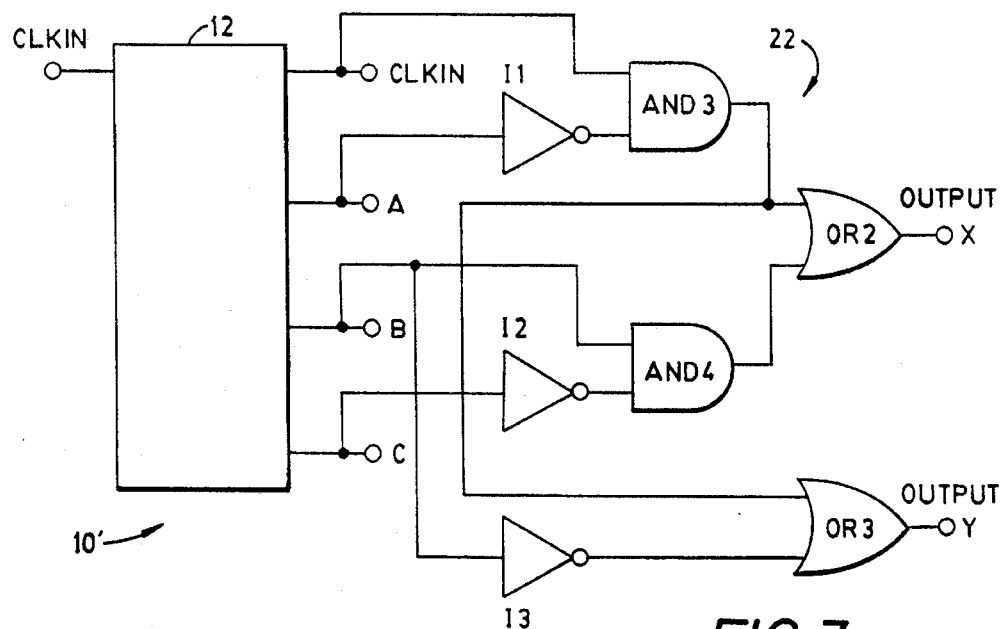
FIG. 3 is a circuit diagram of a second embodiment of this invention.
Figure 4:
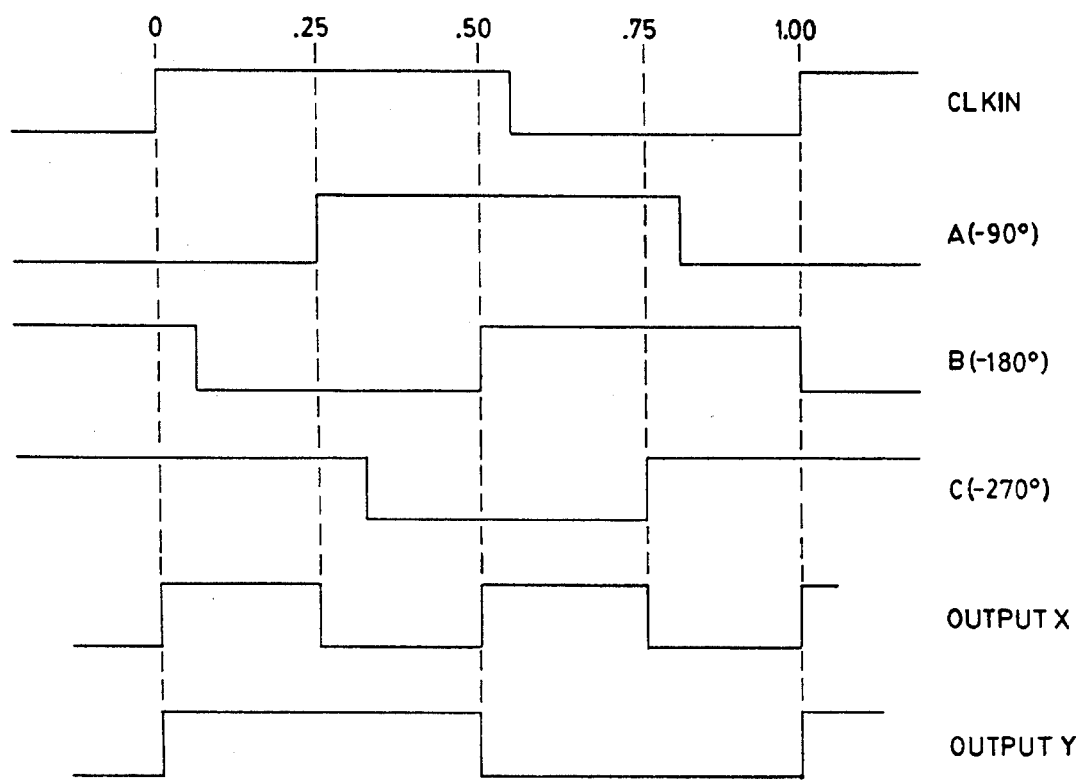
FIG. 4 is a diagram showing the various waveforms that are associated with the circuit of FIG. 3.

Reference is now made to the embodiment of FIG. 3, which is intended to be viewed in conjunction with the waveform diagram of FIG. 4. In this embodiment a clock generation circuit 10 includes the delay circuit 12 of FIG. 1. This embodiment also includes a logic circuit 22 comprised of two AND gates (AND3, AND4), two OR gates (OR2, OR3), and three inverters (I1, I2, I3) which are interconnected to one another and to the output nodes of the delay circuit 12 as shown. The logic circuit has two outputs (OUTPUT X and OUTPUT Y), although both need not be present.

As is best seen in FIG. 4, the logic circuit 22 is arranged such that, although the CLKIN signal has a non-50% duty cycle, the OUTPUT X outputs a 50% duty cycle square wave having a frequency that is twice that of CLKIN, while the OUTPUT Y outputs a 50% duty cycle square wave having a frequency that is equal to the frequency of CLKIN. OUTPUT X and OUTPUT Y are both also synchronized to the CLKIN signal.

As such, this embodiment generates from the input clock (CLKIN) a frequency doubled, 50% duty cycle synchronous output (OUTPUT X), and also a same frequency, 50% duty cycle synchronous output (OUTPUT Y). Furthermore, and as is also the case for the embodiment of FIG. 1, no separate clock oscillator circuit is required.

Having described the circuit embodiments of FIGS. 1 and 3 in conjunction with their associated waveform diagrams, it can be realized that this invention further provides a method of generating a clock signal for use in a digital data processor. This method includes the steps of: (a) inputting an input clock signal having an associated first frequency; (b) generating a plurality of delayed versions of the input clock signal, wherein each delayed version is delayed by a different amount of time from the input clock signal; and (c) logically combining the plurality of delayed versions with the input clock signal to generate an output clock signal having a frequency that is a multiple of the input clock frequency.

Although described above with respect to two exemplary embodiments of the invention, it should be realized that a number of modifications can be made to the teaching of this invention. For example, more or less than three delay elements can be employed. Furthermore, each delay element may introduce a delay that is other than 25% of the period of input clock signal. Also, the construction of the logic circuits 20 and 22 may take a number of different forms, and may also be represented by circuits that ewe logically equivalent to the AND, OR, and inverter functions that are illustrated in FIGS. 1 and 3. Also, output frequency multiples of other than two can be achieved.

In the presently preferred embodiment of this invention the delay circuit 12 is constructed from lumped impedances, and the logic circuits 20 and 22 are implemented in Programmable Logic Arrays (PALs). The use of a PAL is beneficial in that a unity gate delay is achieved for all of the logic gates. However, the use of the invention is not so limited. For example, discrete integrated circuits can be used to implement the logic circuits. Alternately, both the delay circuit and the logic circuit can be implemented within an Application Specific Integrated Circuit (ASIC).

It is noted that the inventor has determined, when using lumped impedance delay elements for the delay circuit 12, that it is desirable to specify the rise and fall times for both the leading and the trailing edges of the delay element output signal.

Thus, while the invention has been particularly shown and described with respect to several embodiments thereof, it will be understood by those skilled in the art that changes in form and details may be made therein without departing from the scope and spirit of the invention.

What is claimed is:

1. A circuit for generating an output signal having a frequency that is a multiple of an input clock signal, comprising:

delay means having an input port and a plurality of output ports, said input port for coupling to the input clock signal, said delay means being comprised of a plurality of serially connected delay elements wherein a first delay element has an input connected to said input clock signal and wherein an output of each of said plurality of serially connected delay elements is connected to one of said output ports, individual ones of said plurality of output ports outputting a signal that preserves a waveform shape of the input clock signal and that is delayed with respect to the input clock signal and also with respect to others of said plurality of output ports; and combinatorial logic means having a first input for coupling to the input clock signal and a plurality of second inputs for coupling to said plurality of output ports, said combinatorial logic means operating to logically combine signals emanating from said plurality of output ports with the input clock signal without storing said input clock signal and without storing any of said signals emanating from said output ports, said combinatorial logic means having an output port for outputting a signal having a frequency that is a multiple of a frequency of the input clock signal and that is synchronous therewith.

2. A circuit as set forth in claim 1 wherein said delay means is comprised of:

a first delay element means having an input for coupling to the input clock signal and an output coupled to a first one of said plurality of output nodes;

a second delay element means having an input coupled to said output of said first delay element means and an output coupled to a second one of said plurality of output nodes; and a third delay element means having an input coupled to said output of said second delay element means and an output coupled to a third one of said plurality of output nodes.

3. A circuit as set forth in claim 2 wherein each of said delay element means introduces an equal amount of delay to a signal propagating therethrough.

4. A circuit as set forth in claim 1 wherein the signal that is output from said output port of said logic means has a 50% duty cycle.

5. A circuit for generating an output signal having a frequency that is a multiple of an input clock signal, comprising:

delay means having an input port and a plurality of output port, said input port for coupling to the input clock signal, individual ones of said plurality of output ports outputting a signal that is delayed with respect to the input clock signal and also with respect to others of said plurality of output ports; and logic means having a first input for coupling to the input clock signal and a plurality of second inputs for coupling to said plurality of output ports, said combinatorial logic means operating to logically combine signals emanating from said plurality of output ports with the input clock signal and having an output port for outputting a signal having a frequency that is a multiple of a frequency of the input clock signal and that is synchronous therewith;

wherein said delay means is comprised of a first delay element means having an input for coupling to the input clock signal and an output coupled to a first one of said plurality of output nodes; a second delay element means having an input coupled to said output of said first delay element means and an output coupled to a second one of said plurality of output nodes; and a third delay element means having an input coupled to said output of said second delay element means and an output coupled to a third one of said plurality of output nodes; wherein each of said delay element means introduces an equal amount of delay to a signal propagating therethrough; and wherein the delay is equal to approximately 25% of the period of the input clock signal.

6. A circuit for generating an output signal having a frequency that is a multiple of an input clock signal, comprising:

delay means having an input port and a plurality of output ports, said input port for coupling to the input clock signal, individual ones of said plurality of output ports outputting a signal that is delayed with respect to the input clock signal and also with respect to others of said plurality of output ports; and logic means having a first input for coupling to the input clock signal and a plurality of second inputs for coupling to said plurality of output ports, said combinatorial logic means operating to logically combine signals emanating from said plurality of output ports with the input clock signal and having an output port for outputting a signal having a frequency that is a multiple of a frequency of the input clock signal and that is synchronous therewith;

wherein said delay means is comprised of a first delay element means having an input for coupling to the input clock signal and an output coupled to a first one of said plurality of output nodes; a second delay element means having an input coupled to said output of said first delay element means and an output coupled to a second one of said plurality of output nodes; and a third delay element means having an input coupled to said output of said second delay element means and an output coupled to a third one of said plurality of output nodes; wherein each of said delay element means introduces an equal amount of delay to a signal propagating therethrough;

wherein the signal that is output from said output port of said logic means has a 50% duty cycle; and wherein the duty cycle of the input clock signal is other than 50%.

7. A circuit for generating an output signal from an input clock signal, comprising:

delay means having an input port and a plurality of output ports, said input port for coupling to the input clock signal, said delay means being comprised of a plurality of serially connected delay elements wherein a first delay element has an input connected to said input clock signal and wherein an output of each of said plurality of serially connected delay elements is connected to one of said output ports, individual ones of said plurality of output ports outputting a signal that preserves a waveform shape of the input clock signal and that is delayed with respect to the input clock signal and also with respect to others of said plurality of output ports; and combinatorial logic means having a first input for coupling to the input clock signal and a plurality of second inputs for coupling to said plurality of output ports, said combinatorial logic means operating to logically combine signals emanating from said plurality of output ports with the input clock signal, said combinatorial logic means having an output port for outputting an output signal having a 50% duty cycle and that is synchronous with the input clock signal; wherein said input clock signal has a duty cycle of other than 50%.

8. A circuit as set forth in claim 7 wherein the signal that is output from said output port has a frequency that is a multiple of the frequency of the input clock signal.

9. A circuit for generating an output signal from an input clock signal, comprising:

delay means having an input port and a plurality of output ports, said input port for coupling to the input clock signal, individual ones of said plurality of output ports outputting a signal that is delayed with respect to the input clock signal and also with respect to others of said plurality of output ports; and combinatorial logic means having a first input for coupling to the input clock signal and a plurality of second inputs for coupling to said plurality of output ports, said combinatorial logic means operating to logically combine signals emanating from said plurality of output ports with the input clock signal, said combinatorial logic means having an output port for outputting an output signal having a 50% duty cycle and that is synchronous with the input clock signal; wherein said input clock signal has a duty cycle of other than 50%, and wherein said delay means is comprised of:

a first delay element means having an input for coupling to the input clock signal and an output coupled to a first one of said plurality of output nodes;

a second delay element means having an input coupled to said output of said first delay element means and an output coupled to a second one of said plurality of output nodes; and a third delay element means having an input coupled to said output of said second delay element means and an output coupled to a third one of said plurality of output nodes.

10. A circuit as set forth in claim 9 wherein each of said delay element means introduces an equal amount of delay to a signal propagating therethrough.

11. A circuit for generating an output signal having a 50% duty cycle from an input clock signal having a duty cycle of other than 50%, comprising:

delay means having an input port and a plurality of output ports, said input port for coupling to the input clock signal, individual ones of said plurality of output ports outputting a signal that is delayed with respect to the input clock signal and also with respect to others of said plurality of output ports; and logic means having a first input for coupling to the input clock signal and a plurality of second inputs for coupling to said plurality of output ports, said logic means operating to logically combine signals emanating from said plurality of output ports with the input clock signal and having an output port for outputting a signal having a 50% duty cycle and that is synchronous with the input clock signal; wherein said delay means is comprised of a first delay element means having an input for coupling to the input clock signal and an output coupled to a first one of said plurality of output nodes; a second delay element means having an input coupled to said output of said first delay element means and an output coupled to a second one of said plurality of output nodes; and a third delay element means having an input coupled to said output of said second delay element means and an output coupled to a third one of said plurality of output nodes;

wherein each of said delay element means introduces an equal amount of delay to a signal propagating therethrough; and wherein the delay is equal to approximately 25% of the period of the input clock signal.

12. A circuit for generating an output signal having a 50% duty cycle from an input clock signal having a duty cycle of other than 50%, comprising:

delay means having an input port and a plurality of output ports, said input port for coupling to the input clock signal, individual ones of said plurality of output ports outputting a signal that is delayed with respect to the input clock signal and also with respect to others of said plurality of output ports; and logic means having a first input for coupling to the input clock signal and a plurality of second inputs for coupling to said plurality of output ports, said logic means operating to logically combine signals emanating from said plurality of output ports with the input clock signal and having an output port for outputting a signal having a 50% duty cycle and that is synchronous with the input clock signal;

wherein the signal that is output from said output port has a frequency that is equal to the frequency of the input clock signal.

13. A method of generating a clock signal for use in a digital data processor, comprising the steps of:

inputting an input clock signal having an associated first frequency;

generating with a plurality of serially coupled delay elements a plurality of delayed versions of the input clock signal, each of the delayed versions preserving a waveform shape of the input clock signal, wherein each delayed version is delayed by a different amount of time from the input clock signal, wherein a first delay element has an input connected to the input clock signal and wherein an output of each of the plurality of serially connected delay elements is connected to one of a plurality of output ports; and logically combining in a combinatorial logic block the plurality of delayed versions appearing at the output ports with the input clock signal to generate an output clock signal having a frequency that is a multiple of the input clock frequency, wherein the step of logically combining is executed without storing the input clock signal and without storing any of the signals appearing at the output ports.

14. A method as set forth in claim 13 wherein the step of logically combining further generates the output clock signal to have a symmetrical waveform.

15. A method as set forth in claim 13 wherein the step of logically combining further generates the output clock signal to be in synchronism with the input clock signal.

16. A method of generating clock signals for use in a digital data processor, comprising the steps of:

inputting an input clock signal having an associated first frequency and a non-symmetrical waveform;

generating a plurality of delayed versions of the input clock signal, wherein each delayed version is delayed by a different amount of time from the input clock signal; and logically combining the plurality of delayed versions with the input clock signal to generate (a) a first output clock signal having a frequency that is a multiple of the input clock frequency and a symmetrical waveform, and (b) a second output clock signal having a frequency that is equal to the input clock frequency and a symmetrical waveform.

17. A method as set forth in claim 16 wherein the step of logically combining further generates the first and the second output clock signals to be in synchronism with the input clock signal.

* * * * *